United States Patent
Shi et al.

(10) Patent No.: US 10,476,488 B2
(45) Date of Patent: Nov. 12, 2019

(54) JITTER CANCELLATION WITH AUTOMATIC PERFORMANCE ADJUSTMENT

(71) Applicant: Micron Technology, Inc., Boise, ID (US)

(72) Inventors: Dan Shi, Folsom, CA (US); Fangxing Wei, Folsom, CA (US); Michael J. Allen, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/184,474

(22) Filed: Nov. 8, 2018

(65) Prior Publication Data

US 2019/0207594 A1 Jul. 4, 2019

Related U.S. Application Data

(63) Continuation of application No. 15/857,157, filed on Dec. 28, 2017, now Pat. No. 10,164,618.

(51) Int. Cl.
| | |
|---|---|
| *H03L 7/10* | (2006.01) |
| *H03K 5/06* | (2006.01) |
| *H03K 5/08* | (2006.01) |
| *H03K 5/156* | (2006.01) |
| *G06F 1/08* | (2006.01) |

(52) U.S. Cl.
CPC ............. *H03K 5/065* (2013.01); *H03K 5/082* (2013.01); *H03K 5/1565* (2013.01); *G06F 1/08* (2013.01)

(58) Field of Classification Search
CPC ..................................................... H03H 11/54
See application file for complete search history.

(56) References Cited

U.S. PATENT DOCUMENTS

| | | | | |
|---|---|---|---|---|
| 5,270,875 | A | * 12/1993 | Shah | ................ G11B 20/10009 360/46 |
| 5,828,255 | A | 10/1998 | Kelkar | |

(Continued)

OTHER PUBLICATIONS

ISA/KR, International Search Report and Written Opinion of the International Searching Authority, Int'l. Appl. No. PCT/US2018/066205, dated Apr. 12, 2019, Korean Intellectual Property Office, Seo-gu, Daejeon, Republic of Korea, 9 pgs.

*Primary Examiner* — Adam D Houston
(74) *Attorney, Agent, or Firm* — Holland & Hart LLP

(57) ABSTRACT

Methods, systems, and devices for jitter cancellation with automatic performance adjustment are described. Within a clock distribution system in an electronic device (e.g., a memory device), a jitter cancellation system may be configured to introduce delay between an input clock signal and output clock signal that is directly proportional to the supply voltage for the clock distribution system. In response to supply noise, the delay introduced by the jitter cancellation system may vary directly with respect to the supply voltage fluctuations and thus may offset fluctuations in the delay introduced by other components of the clock distribution system, which may vary inversely with respect to the supply voltage fluctuations. A control component within the jitter cancellation system may execute an algorithm to adjust or regulate the delay introduced by the jitter cancellation system, including its responsiveness to fluctuations in the supply voltage.

20 Claims, 9 Drawing Sheets

(56) References Cited

U.S. PATENT DOCUMENTS

| | | | |
|---|---|---|---|
| 6,396,934 B1* | 5/2002 | Federspiel | H03H 11/1291 330/282 |
| 6,960,943 B1 | 11/2005 | Poulson | |
| 7,323,912 B2* | 1/2008 | Nielsen | H03K 17/063 326/83 |
| 8,325,865 B1* | 12/2012 | Rofougaran | H04B 1/001 375/316 |
| 8,344,810 B2* | 1/2013 | Lian | H03F 3/187 330/305 |
| 8,436,670 B2 | 5/2013 | Ma | |
| 10,097,163 B2* | 10/2018 | Lee | H03H 11/0422 |
| 2003/0117192 A1 | 6/2003 | Lee | |
| 2005/0129156 A1* | 6/2005 | Lourens | H03H 11/1252 375/350 |
| 2006/0056561 A1 | 3/2006 | Zhang | |
| 2006/0273831 A1 | 12/2006 | Maksimovic et al. | |
| 2008/0036536 A1* | 2/2008 | Khorramabadi | H01F 17/0013 330/252 |
| 2008/0100374 A1* | 5/2008 | Papananos | H03H 11/1291 327/553 |
| 2009/0256605 A1 | 10/2009 | Yoshizawa et al. | |
| 2010/0097152 A1* | 4/2010 | Wang | H03H 11/1291 331/44 |
| 2010/0141311 A1 | 6/2010 | Kim et al. | |
| 2010/0156575 A1* | 6/2010 | Shah | H03J 3/08 334/78 |
| 2010/0244943 A1* | 9/2010 | Hahn | H03H 11/1291 327/553 |
| 2010/0244945 A1* | 9/2010 | Hahn | H03H 7/0153 327/553 |
| 2010/0253404 A1 | 10/2010 | Ma | |
| 2011/0221480 A1* | 9/2011 | Ikeda | H03K 17/04123 327/109 |
| 2011/0254644 A1* | 10/2011 | Nutt | H03K 19/0008 334/39 |
| 2011/0304367 A1 | 12/2011 | Oh et al. | |
| 2012/0062190 A1* | 3/2012 | Haiplik | H02M 3/156 323/271 |
| 2012/0062291 A1 | 3/2012 | Saitoh | |
| 2012/0130651 A1* | 5/2012 | Papadimitriou | G01N 27/9046 702/35 |
| 2012/0133420 A1* | 5/2012 | Draxelmayr | H02M 3/337 327/430 |
| 2012/0146539 A1* | 6/2012 | Riesebosch | H05B 33/089 315/291 |
| 2012/0182057 A1 | 7/2012 | Ma et al. | |
| 2012/0256674 A1* | 10/2012 | Foroudi | H03H 11/245 327/308 |
| 2012/0293248 A1* | 11/2012 | Chen | H03H 11/1213 327/553 |
| 2013/0040592 A1* | 2/2013 | Lee | H03H 11/1291 455/226.1 |
| 2013/0109334 A1* | 5/2013 | Kwon | H04B 1/0475 455/114.3 |
| 2013/0154738 A1* | 6/2013 | Lee | H03G 3/002 330/254 |
| 2013/0157604 A1 | 6/2013 | Jantzi et al. | |
| 2013/0169320 A1* | 7/2013 | van Dijk | H01L 24/73 327/109 |
| 2013/0225101 A1* | 8/2013 | Basaran | H03H 7/12 455/79 |
| 2013/0265029 A1* | 10/2013 | Akiyama | H03K 17/94 323/311 |
| 2013/0278341 A1* | 10/2013 | Tsou | H03F 3/193 330/271 |
| 2013/0285722 A1 | 10/2013 | Chou | |
| 2013/0342256 A1 | 12/2013 | Wadhwa et al. | |
| 2014/0002145 A1* | 1/2014 | Mauder | H03K 17/06 327/109 |
| 2014/0065992 A1* | 3/2014 | Lee | H03H 11/1291 455/139 |
| 2014/0103962 A1* | 4/2014 | Ajram | H03K 17/082 327/108 |
| 2014/0333373 A1* | 11/2014 | Pamarti | H03H 19/00 327/553 |
| 2015/0035622 A1* | 2/2015 | Maxim | H03F 1/565 333/202 |
| 2015/0094008 A1* | 4/2015 | Maxim | H01F 17/0013 455/245.1 |
| 2015/0236663 A1* | 8/2015 | Buer | H03F 3/19 455/20 |
| 2015/0236748 A1* | 8/2015 | Nobbe | H04B 17/12 455/78 |
| 2015/0381129 A1* | 12/2015 | Brekelmans | H03G 3/18 330/254 |
| 2016/0254810 A1* | 9/2016 | Rossberg | H03K 17/04206 327/109 |
| 2016/0352235 A1* | 12/2016 | Imai | H02M 3/33569 |
| 2016/0365859 A1* | 12/2016 | Song | H03K 19/018514 |
| 2016/0377433 A1 | 12/2016 | Moriguchi | |
| 2017/0030954 A1 | 2/2017 | Whatmough et al. | |
| 2017/0033759 A1* | 2/2017 | Saigusa | H04B 1/10 |
| 2017/0149411 A1* | 5/2017 | Nielsen | H03G 3/3042 |
| 2017/0302243 A1* | 10/2017 | Horita | H01P 1/20 |
| 2018/0115237 A1* | 4/2018 | Morin | H02M 3/156 |
| 2018/0294732 A1* | 10/2018 | Ye | H02M 3/33546 |

* cited by examiner

JITTER CANCELLATION WITH AUTOMATIC PERFORMANCE ADJUSTMENT

CROSS REFERENCE

The present Application for Patent is a continuation of U.S. patent application Ser. No. 15/857,157, by Shi et al., entitled "Jitter Cancellation with Automatic Performance Adjustment," filed Dec. 28, 2017, assigned to the assignee hereof, which is expressly incorporated by reference in its entirety herein.

BACKGROUND

The following relates generally to jitter cancellation and more specifically to jitter cancellation with automatic performance adjustment.

In the context of a digital signal, jitter may refer to deviation of the digital signal from a desired timing characteristic, such as a deviation in phase, period, pulse width, or duty cycle. For example, in the context of a clock signal with rising and falling edges, jitter may refer to deviation of a rising or falling edge from a desired or ideal location in time. In some cases, jitter may refer to a misalignment between two signals, such as a misalignment between one clock signal and another clock signal (e.g., rising or falling edges that are not synchronized between the two clock signals or are offset between the two clock signals by an undesired amount). In an electronic circuit, possible sources of jitter include but are not limited to oscillator imperfections, thermal noise, and supply voltage fluctuations. Jitter may be detrimental to the operation of electronic devices, including memory devices.

Improved solutions for mitigating jitter in electronic devices, including memory devices, are desired.

DETAILED DESCRIPTION

Figure 1:
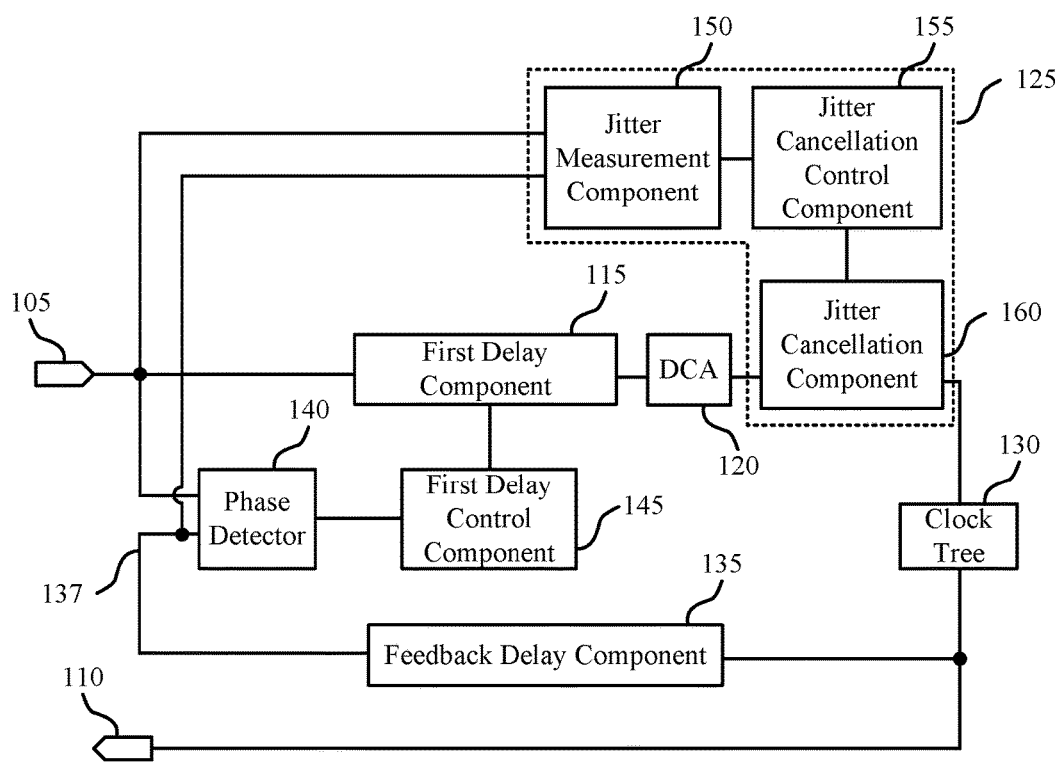
FIG. 1 illustrates an example of a clock distribution system that supports jitter cancellation with automatic performance adjustment in accordance with embodiments of the present disclosure.

In some electronic devices, such as memory devices, various clock signals may be utilized to coordinate the timing of different operations. In some cases, an electronic device may utilize different clock signals at different locations with the electronic device, and the different clock signals may be based on a reference clock signal, among other aspects. For example, a memory device may include an input or output interface that utilizes a data strobe, and the data strobe may be a clock signal generated based on a reference clock signal.

In some cases, jitter may refer to a misalignment between two signals, such as a misalignment between one clock signal and another clock signal (e.g., rising or falling edges that are not synchronized between the two clock signals or are offset between the two clock signals by an undesired amount). The detrimental impact of jitter (e.g., misalignment) between two clock signals may increase as timing requirements become tighter (e.g., as timing margins shrink), which may lead to additional challenges and lower performance. Thus, in the case of a data strobe for a memory device interface, the detrimental impact of jitter between the data strobe and a reference clock signal may be exacerbated as data rates for the memory device interface increase. For example, the detrimental impact of jitter between the data strobe and the reference clock signal may be exacerbated when the memory device interface is configured as a double data rate (DDR) interface.

Jitter between two clock signals (e.g., between a data strobe and a reference clock signal) may arise at least in part due to fluctuations in a supply voltage, which may be referred to as supply noise, because such fluctuations may impact an amount of delay between the two clock signals. Accordingly, some other techniques for mitigating jitter may include the use of voltage regulators configured to suppress supply noise. Adding voltage regulators to an electronic device may, however, increase the amount of power consumed by the electronic device and may also increase latency when a power state of the electronic device (e.g., a power-saving mode versus a high-performance mode) changes.

The devices and techniques described herein may beneficially reduce jitter between two clock signals in an electronic device, and thus may support improved reliability and improved data rates for electronic devices. For example, in the context of a memory devices, the devices and techniques described herein may beneficially reduce jitter between a data strobe signal and a reference clock signal, and thus may support improved reliability and improved read/write speeds for the memory device. Further, the devices and techniques described herein may beneficially avoid increased power consumption and latencies that may result from other jitter mitigation techniques.

For example, a jitter cancellation component as described herein may be introduced into a signal path between two clock signals (e.g., between a reference clock signal and another clock signal that is based on the reference clock signal) that is configured to introduce into the signal path an amount of delay that is proportional (that is, directly proportional, as opposed to inversely proportional) to a supply voltage. Other circuitry in the signal path may, at least in aggregate, introduce delay that varies inversely relative to the supply voltage—e.g., as supply voltage increases, the speed of the other circuitry in the signal path may increase, and thus the delay introduced by the other circuitry may decrease—which may cause jitter between the two clock signals.

By introducing delay that is directly proportional to supply voltage, and thus varies directly in response to supply voltage fluctuations, the jitter cancellation component may offset fluctuations (e.g., inversely proportional fluctuations) in the delay that may be introduced by other circuitry in the signal path. Further, as described herein, a jitter cancellation control component may execute an algorithm to configure the jitter cancellation component (e.g., adjust the amount of offsetting delay introduced into the signal path by the jitter cancellation component, or, additionally or alternatively, a responsiveness of the jitter cancellation component to supply voltage fluctuations) so as to adjust or minimize a sensed amount of jitter between the two clock signals.

Features of the disclosure introduced above are further described below in the context of an example of a clock distribution system that includes a jitter cancellation system, with reference to FIG. 1, an example of a jitter cancellation component within the jitter cancellation system, with reference to FIG. 2, and example delay curves for a clock distribution system that includes a jitter cancellation system, with reference to FIG. 3. Features of the disclosure are then further described in the context of examples of adjustment algorithms that may be executed by a jitter cancellation control component, with reference to FIGS. 4 and 5, and an example of a timing diagram for a clock distribution system that includes a jitter cancellation system, with reference to FIG. 6. These and other features of the disclosure are further illustrated by and described with reference to flowcharts that relate to jitter cancellation with automatic performance adjustment (e.g., FIGS. 7-9).

FIG. 1 illustrates an example of a clock distribution system 100 that supports jitter cancellation with automatic performance adjustment in accordance with various embodiments of the present disclosure. The clock distribution system 100 may include a first delay component 115, a duty cycle adjustor (DCA) 120, a jitter cancellation system 125, a clock tree 130, a feedback delay component 135, a phase detector 140, and a first delay control component 145. The jitter cancellation system 125 may include a jitter measurement component 150, a jitter cancellation control component 155, and a jitter cancellation component 160.

The clock distribution system 100 may receive an input signal 105 and may output an output signal 110. In some cases, the input signal 105 may be a clock signal, such as a reference clock signal for a memory device or other electronic device, and the output signal 110 may be a delayed clock signal based on the clock signal. For example, the output signal 110 may be a data strobe signal for an interface of a memory device, such as a DDR output interface of the memory device. In some cases, the clock distribution system 100 may receive the input signal 105 as one branch of a clock tree (not shown in FIG. 1) within the memory device or other electronic device.

The clock distribution system 100 may comprise a feedback loop, which may include a forward path (e.g., the forward clock path) interposed between the input signal 105 and the output signal 110 as well as a feedback path. The clock distribution system 100 may be configured to introduce a total amount of delay into the forward clock path, and thus between the input signal 105 and the output signal 110, that is equal to multiple of a period of the input signal 105.

For example, the clock distribution system 100 may in some cases be configured to introduce a total amount of delay between the input signal 105 and the output signal 110 that is equal to one period of the input signal 105, in which case the output signal 110 may have rising and falling edges that are synchronized with rising and falling edges of the input signal 105. A total amount of delay equal to one period of the input signal 105 may be desirable, for example, because achieving zero delay between the output signal 110 and the input signal 105 may not be practicable (e.g., due to physical distance between the output signal 110 and the input signal 105). A total amount of delay equal to one period of the input signal 105 is, however, just one example. The clock distribution system 100 may be configured to introduce a total amount of delay between the output signal 110 and the input signal 105 that is equal to multiple of a period of the input signal 105

The forward path of the feedback loop may include the first delay component 115, the DCA 120, the jitter cancellation component 160, and the clock tree 130. The feedback path of the feedback loop may include the feedback delay component 135, the phase detector 140, the first delay control component 145, the jitter measurement component 150.

The first delay component 115 may receive the input signal 105. In some cases, the first delay component 115 may be a delay line included in a delay locked loop (DLL). The first delay component 115 may include any number of transistors, diodes, resistors or other electrical components and may be configured to introduce a first amount of desired delay into the forward path of the feedback loop. The first amount of desired delay may be any fraction of the total amount of delay introduced by the clock distribution system 100 and may be inversely proportional to a supply voltage for the clock distribution system 100. Thus, fluctuations in the supply voltage (that is, supply noise for the clock distribution system 100) may cause inversely proportional fluctuations in the amount of delay introduced by the first delay component 115, as an increase in the supply voltage may result in an increased speed for the electrical components included within the first delay component 115.

In some examples, the clock distribution system 100 may include the DCA 120, which may receive the output of the first delay component 115 and may output a signal having a different duty cycle. Thus, in some examples, the output signal 110 may have a different duty cycle that the input signal 105, and the DCA 120 may be configured to introduce the difference in duty cycle. In some examples, the DCA 120 may not be present. In examples that include the DCA 120, the amount of delay introduced into the forward path of the clock distribution system 100 by the DCA 120 may be inversely proportional to the supply voltage of the clock distribution system 100, as an increase in the supply voltage may result in an increased speed for the electrical components included within the DCA 120.

The jitter cancellation component 160, which may be included in the jitter cancellation system 125, may receive the output of the DCA 120 (or, in examples where the DCA is not present, may receive the output of the first delay component 115). The jitter cancellation component 160 may include any number of transistors, diodes, resistors or other electrical components and may be configured to introduce a second amount of desired delay into the forward path of the feedback loop. The second amount of desired delay may be any fraction of the total amount of delay introduced by the clock distribution system 100.

In some cases, the first delay component 115 and the jitter cancellation component 160 may be configured such that the first amount of desired delay introduced by the first delay component 115 plus the second amount of desired delay introduced by the jitter cancellation component 160 plus any other delay present in the forward path of the clock distribution system 100 (e.g., delay introduced by the DCA 120 or by the clock tree 130) equals the total amount of desired delay between the output signal 110 and the input signal 105. Further, the jitter cancellation component 160 may be configured such that the second amount of desired delay is proportional to the supply voltage of the clock distribution system 100. Thus, fluctuations in the supply voltage may cause directly proportional fluctuations in the amount of delay introduced by the jitter cancellation component 160. Hence, in the presence of supply noise, the jitter cancellation component 160 may counteract jitter introduced by the first delay component 115 or other aspects of the clock distribution system 100.

In some examples, the clock distribution system 100 may include a clock tree, such as the clock tree 130, in the forward path of the feedback loop, and the output signal 110 may be one branch of the output by the clock tree 130 (with various other branches being present but not shown in FIG. 1). In some examples, the clock tree 130 may be omitted. In examples that include the clock tree 130, the amount of delay introduced into the forward path of the clock distribution system 100 by the clock tree 130 may be inversely proportional to the supply voltage of the clock distribution system 100, as an increase in the supply voltage may result in an increased speed for the electrical components included within the clock tree 130.

In the feedback path, the feedback delay component 135 may receive the output signal 110 and may output feedback signal 137, which may be a delayed version of the output signal 110. The feedback delay component 135 may include any number of transistors, diodes, resistors or other electrical components and may be configured to introduce a desired amount of delay into the feedback path of the feedback loop.

The phase detector 140 may compare the phase of the feedback signal 137 with the input signal 105 in order to determine a phase difference between the feedback signal 137 and the input signal 105. The phase detector 140 may output to the first delay control component 145 a signal reflective of the phase difference. The first delay control component 145 may output a control signal to the first delay component 115 based on the phase difference. The first amount of desired delay, introduced by the first delay component 115, may be configurable, and the first delay control component 145 may configure the first delay component 115 (and thus the resulting first amount of desired delay) based on the phase difference determined by the phase detector 140.

The jitter measurement component 150, which may be included in the jitter cancellation system 125, may determine an amount of jitter between the feedback signal 137 and the input signal 105, which may also reflect an amount of jitter between the output signal 110 and the input signal 105. In some cases, the jitter measurement component 150 may determine the amount of jitter between the feedback signal 137 and the input signal 105 based on a timing difference between the feedback signal 137 and the input signal 105, such as a difference in phase or an offset between rising or falling edges of the feedback signal 137 and the input signal 105. The jitter measurement component 150 may output a signal reflective of the jitter between the feedback signal 137 and the input signal 105 to the jitter cancellation control component 155. The jitter cancellation control component 155 may output a control signal to the jitter cancellation component 160 based on the measured jitter between the feedback signal 137 and the input signal 105.

The responsiveness of the jitter cancellation component 160 to noise, such as supply noise—e.g. the ratio according to which a change in the supply voltage causes a directly proportional change in the delay introduced by the jitter cancellation component 160—may be configurable, and the jitter cancellation control component 155 may configure the jitter cancellation component 160 (and thus the responsiveness of the jitter cancellation component 160 to supply noise) based on the amount of jitter measured by the jitter measurement component 150. Thus, the jitter cancellation control component 155 may automatically adjust or regulate the performance of the jitter cancellation component 160.

It is to be understood that aspects of the clock distribution system 100 as shown in the example illustrated in FIG. 1 may be arranged differently in other examples. For example, the first delay component 115, the DCA 120, the jitter cancellation component 160, and the clock tree 130 may be arranged in a different order within the forward path of the clock distribution system 100.

In some cases, the clock distribution system 100 may be included in a memory device. Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory devices, e.g., FeRAM memory devices, may maintain their stored logic states for extended periods of time even in the absence of an external power source. Volatile memory devices, e.g., DRAM, may lose their stored logic states over time unless they are periodically refreshed by an external power source.

FeRAM memory devices may use similar device architectures as volatile memory but may have non-volatile properties due to the use of a ferroelectric capacitor as a storage device. FeRAM memory devices may thus have improved performance compared to other non-volatile and volatile memory devices. An FeRAM memory device may include any number of ferroelectric memory cells, and each ferroelectric memory cell may include a capacitor with a ferroelectric as the insulating material. Ferroelectric materials have non-linear polarization properties, and different levels of charge of a ferroelectric capacitor may represent different logic states. Within an FeRAM memory device, ferroelectric memory cells may arranged as a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both.

Memory cells within a memory device, such as a PCM memory device or RRAM memory device, may be arranged using a cross point architecture. In a cross point architecture, each row of memory cells may be connected to a single word line, each column of memory cells may be connected to a single bit line, and each memory cell may correspond to a cross point of one word line and one bit line. Word lines and bit lines may be disposed at different levels of a cross point architecture, with word lines orthogonal to bit lines and a memory cell disposed at an intervening layer at each cross point of a word line and a bit line. Such a cross point architecture may offer relatively high-density data storage with lower production costs compared to other memory architectures. For example, the cross-point architecture may have memory cells with a reduced area and, resultantly, an increased memory cell density compared to other architectures.

Figure 2:
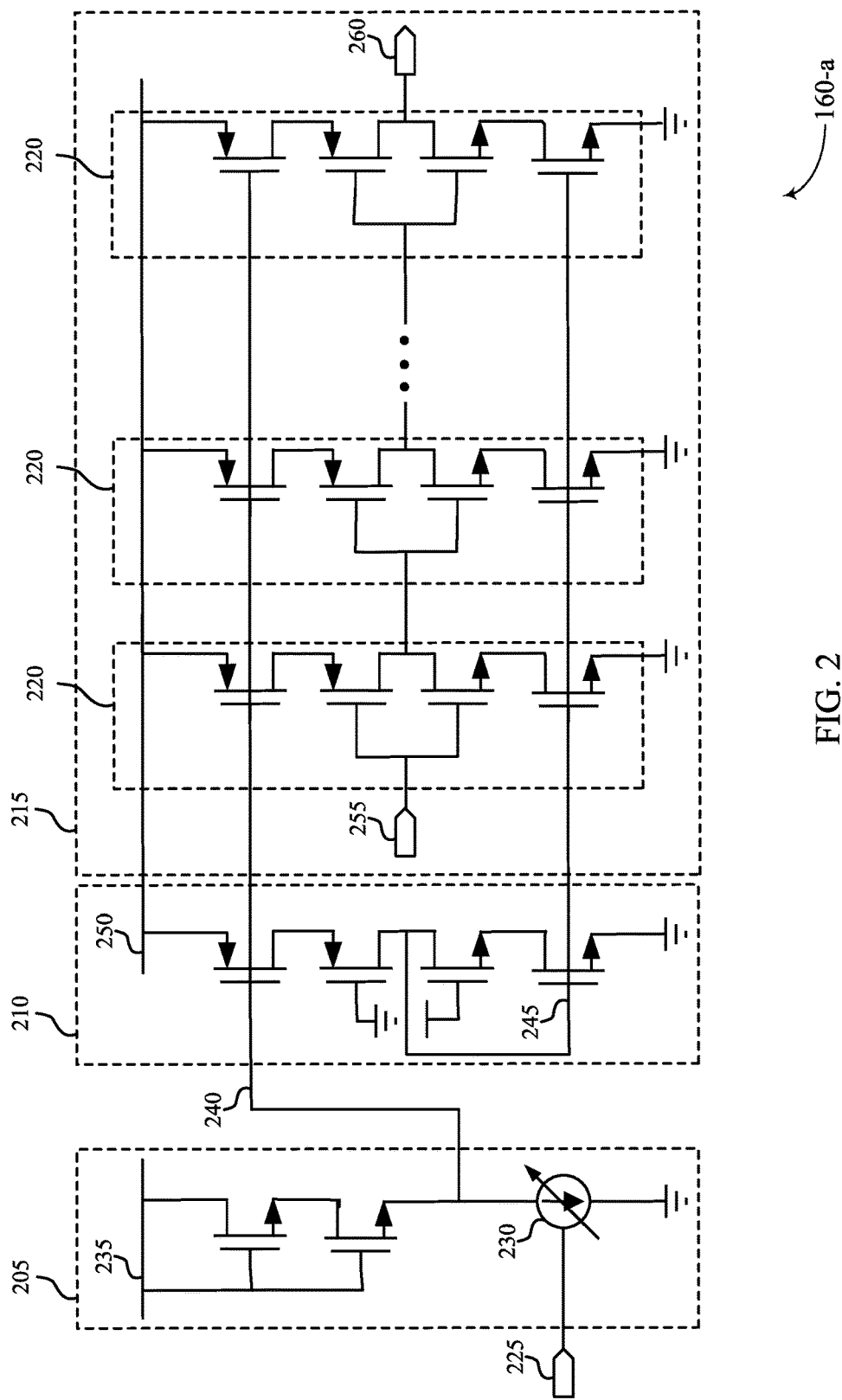
FIG. 2 illustrates an example of a jitter cancellation component that supports jitter cancellation with automatic performance adjustment in accordance with embodiments of the present disclosure.

FIG. 2 illustrates an example of a jitter cancellation component 160-a that supports jitter cancellation with automatic performance adjustment in accordance with various embodiments of the present disclosure. The jitter cancellation component 160-a may include a first bias circuit 205, a second bias circuit 210, and a delay circuit 215. The delay circuit 215 may include any number of delay cells 220.

The first bias circuit 205 may receive a control signal 225. In some cases, the control signal 225 may be received from a jitter cancellation control component 155 such as that described in reference to FIG. 1. In some cases, the control signal 225 may control a current source 230. The current source 230 may be a digitally-controlled current source, which may be referred to as an IDAC (or current digital-to-analog converter). The control signal 225 may comprise or otherwise include an indicator of a desired current level (e.g., a binary control number, or an indication of a current level increment or decrement by some number of current levels), and the current level of the current source 230 may be based on (e.g., set to a desired value by) the indicator. The first bias circuit 205 may be powered by a supply voltage 235, which may be the supply voltage for a clock distribution system 100. In some cases, the supply voltage 235 may be unregulated (e.g., not output by a voltage regulator) such as that described in reference to FIG. 1.

The first bias circuit may generate a first bias voltage 240. The first bias voltage 240 may be based on the voltage of the supply voltage 235 and the current level of the current source 230. The first bias voltage 240 may be directly proportional to the supply voltage 235, and thus an increase or decrease in the supply voltage 235—e.g., due to supply noise—may cause a corresponding increase or decrease in the first bias voltage 240.

In some cases, the first bias voltage may be inversely proportional to the current level of the current source 230, and thus an increase or decrease in the current level of the current source 230 may cause a corresponding decrease or increase in the first bias voltage 240. Further, the responsiveness of the first bias voltage 240 to fluctuations in the supply voltage 235 may be based on the current level of the current source 230. For example, the responsiveness of the first bias voltage 240 to fluctuations in the supply voltage 235 may be inversely proportional the current level of the current source 230. That is, if the current source 230 is configured at a relatively lower current level, a given increase in the supply voltage 235 may cause a relatively larger increase in the first bias voltage 240 than if the current source 230 if configured at a relatively higher currently level, as explained below in reference to FIG. 3.

The second bias circuit 210 may receive (e.g., be biased by) the first bias voltage 240 and may generate, based on the first bias voltage 240, a second bias voltage 245. The second bias voltage 245 may be inversely proportional to the first bias voltage 240, and thus inversely proportional to the supply voltage 235. In some cases, the second bias circuit may be powered by a regulated supply voltage 250, which may in some cases be generated by a voltage regulator (not shown in FIG. 2).

The delay circuit 215 may receive an input clock signal 255 and may generate an output clock signal 260. The delay circuit 215 may include any number of delay cells 220. An even number of delay cells 220 may avoid a phase shift (e.g. 180 degree phase shift) between the input clock signal 255 and the output clock signal 260. In some cases, each delay cell 220 may be biased by both the first bias voltage 240 and the second bias voltage 245. For example, each delay cell 220 may comprise a CMOS inverter, and a pull-up transistor of the inverter may be biased by the first bias voltage 240 while a pull-down transistor may be biased by the second bias voltage 245. The delay cells 220 may be arranged in series between the input clock signal 255 and the output clock signal 260, and thus the delay between the input clock signal 255 and the output clock signal 260 may include a first portion (e.g., a steady-state portion) that may be based on the number of delay cells 220 included in the delay circuit 215. The first portion may also be inversely proportional to the current level of the current source 230, as a higher current level may decrease the first bias voltage 240, and a lower current level may increase the first bias voltage 240.

Further, the delay introduced by a delay cell 220 (and thus the total delay introduced by the delay circuit 215) may include a second portion (e.g., a fluctuating portion that fluctuates in response to changes in the supply voltage 235) that may be directly proportional to the first bias voltage 240 and thus directly proportional to the supply voltage 235 (and inversely proportional to the second bias voltage 245). For example, in response to an increase in the supply voltage 235, the first bias voltage 240 may increase, the second bias voltage 245 may decrease, and the delay introduced by the delay circuit 215 between the input clock signal 255 and the output clock signal 260 may increase. Further, the responsiveness of each delay cell 220 (and thus of the delay circuit 215) to fluctuations in the supply voltage 235 may be inversely proportional the current level of the current source 230, based on the level of responsiveness of the first bias voltage 240.

Figure 3:
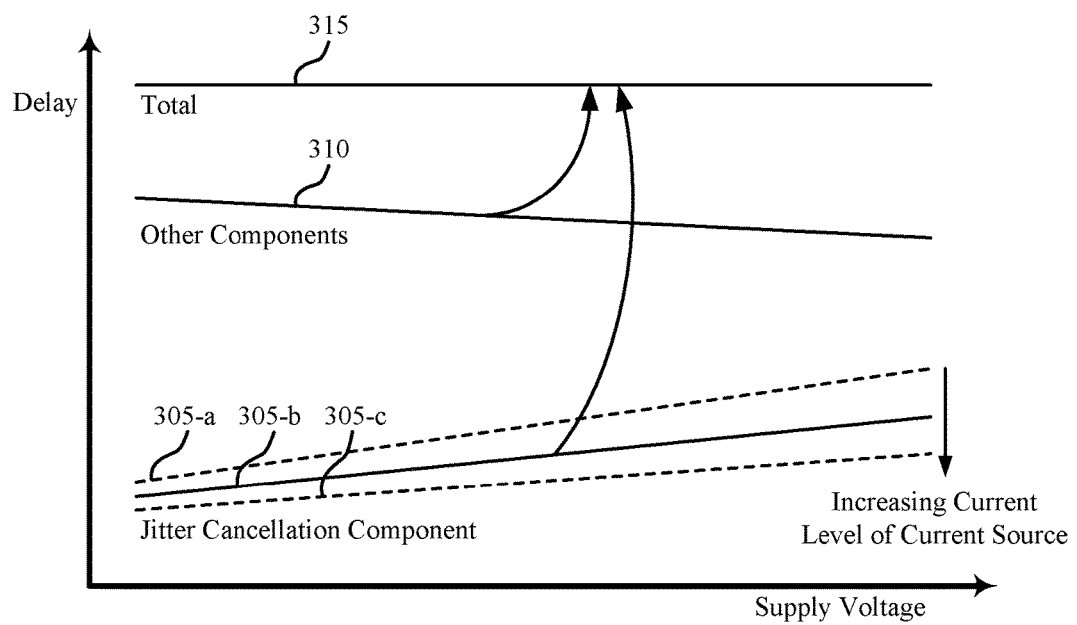
FIG. 3 illustrates an example of delay curves for a clock distribution system that supports jitter cancellation with automatic performance adjustment in accordance with embodiments of the present disclosure.

FIG. 3 illustrates an example of delay curves 300 for a clock distribution system, such as the example of clock distribution system 100 described in reference to FIG. 1, that supports jitter cancellation with automatic performance adjustment in accordance with various embodiments of the present disclosure.

Delay curves 305-a, 305-b, 305-c may illustrate the delay between an input signal (e.g., the input signal 255 described in reference to FIG. 2) and an output signal (e.g., the output signal 260 described in reference to FIG. 2) introduced by a jitter cancellation component 160 as a function of supply voltage for the clock distribution system (e.g., the supply voltage 235 described in reference to FIG. 2). Delay curve 305-a may correspond to a first current level of a current source 230; delay curve 305-b may correspond to a second current level of the current source 230; and delay curve 305-c may correspond to a third current level of the current source 230.

Delay curve 310 may illustrate the delay between the input signal and the output signal between the input signal and the output signal introduced by other components in the clock distribution system (e.g., the aggregate delay introduced by the first delay component 115, the DCA 120, and the clock tree 130 described in reference to FIG. 1). As shown by delay curve 310, the delay introduced by other forward path components may be inversely proportional to supply voltage, and thus may decrease as supply voltage increases. Accordingly, fluctuations in the supply voltage (e.g., supply noise) may cause inversely proportional fluctuations in the delay introduced by other forward path components.

As shown by delay curves 305-a, 305-b, 305-c, the delay introduced by the jitter cancellation component 160 may, however, be directly proportional to supply voltage, and thus may increase as supply voltage increases. Accordingly, fluctuations in the supply voltage (e.g., supply noise) may cause directly proportional fluctuations in the delay introduced by the jitter cancellation component 160 that may offset the inversely proportional fluctuations in the in the delay introduced by the other components.

Further, the slope of the delay curve 305 for the jitter cancellation component 160 may depend on the current level of the current source 230. In some cases, the slope of the delay curve 305 for the jitter cancellation component 160 may be inversely related to the current level of the current source 230. Thus, at a first current level of the current source 230, which may correspond to delay curve 305-a, the slope of the delay curve 305 for the jitter cancellation component 160 may be relatively steep, and a given change in the supply voltage may cause a relatively large change in the delay introduced by the jitter cancellation component 160, as compared to when the current level of the current source 230 is at a second, higher current level (which may correspond to delay curve 305-b) or a third, highest current level (which may correspond to delay curve 305-c).

For example, at the third, relatively highest current level of the current source 230, as shown by delay curve 305-c, the slope of the delay curve 305 for the jitter cancellation component 160 may be relatively flat, and a given change in the supply voltage may cause a relatively small change in the delay introduced by the jitter cancellation component 160. Similarly, at the second current level of the current source 230, which may be in between the first current level and the third current level, the delay curve 305 for the jitter cancellation component 160 may have an intermediate slope, as shown by delay curve 305-b. Thus, the responsiveness of the jitter cancellation component 160 to a change in the supply voltage may be inversely proportional to the current level of the current source 230. Further though three delay curves 305 are shown, corresponding to three current levels, it is to be understood that a current source 230 may support any number of current levels.

Delay curve 315 may illustrate the total delay between the input signal and the output signal. A control component for the jitter cancellation component 160, such as the jitter cancellation control component 155 described in reference to FIG. 1, may be configured to automatically adjust or regulate the current level of the current source 230 in order to influence the delay curve 305 for the jitter cancellation component 160—e.g., achieve a delay curve 305 that offsets the delay curve 310 for other forward path components, such that the total delay curve 315 may be substantially flat and thus minimally responsive to fluctuations in the supply voltage, as minimal responsiveness to fluctuations in the supply voltage may correspond to minimal jitter between the input signal and the output signal in the presence of supply noise. For example, as indicated by the solid line of the delay curve 305-b versus the dashed lines of the delay curve 305-a and the delay curve 305-c, the control component may configure the current level of the current source 230 so as to achieve the delay curve 305-b. Thus, as illustrated in FIG. 3, the total delay curve 315 may represent the sum of delay curve 305-b and delay curve 310.

Figure 4:
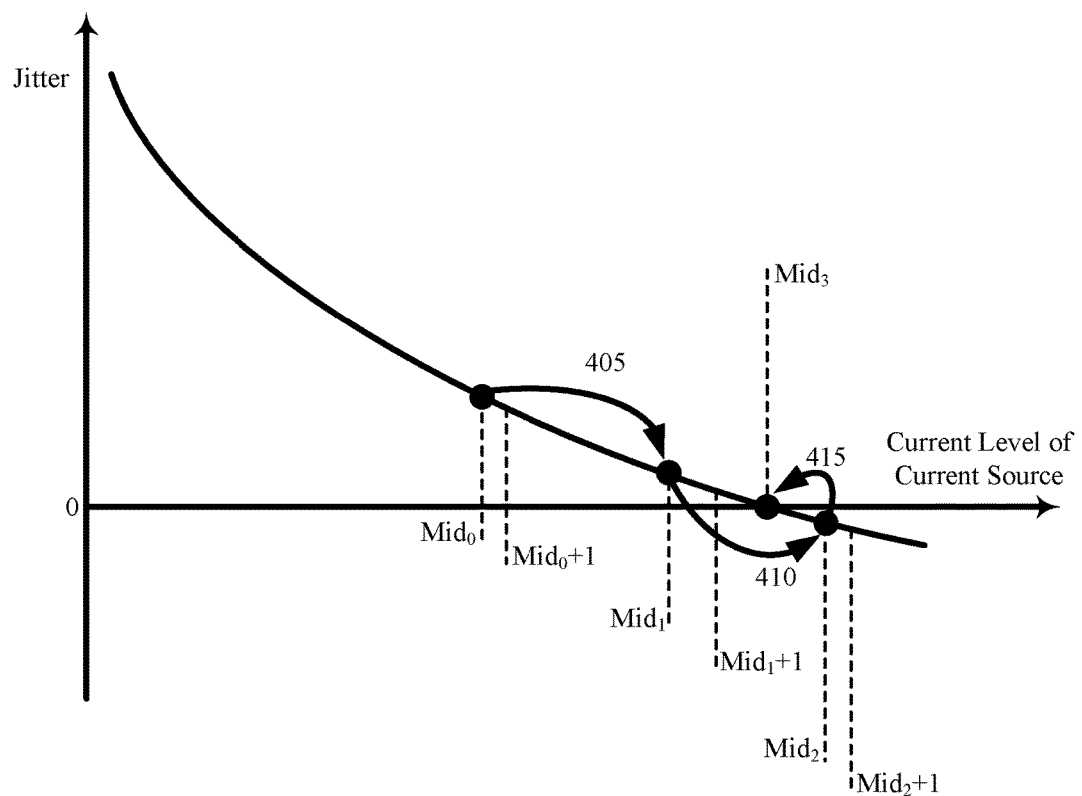
FIG. 4 illustrates an example of an adjustment algorithm for a clock distribution system that supports jitter cancellation with automatic performance adjustment in accordance with embodiments of the present disclosure.

FIG. 4 illustrates an example of an adjustment algorithm 400 for a clock distribution system that supports jitter cancellation with automatic performance adjustment in accordance with various embodiments of the present disclosure. In some cases, adjustment algorithm 400 may be implemented by a control component for a jitter cancellation component 160 with a clock distribution system 100. For example, adjustment algorithm 400 may be implemented by a jitter cancellation control component 155 as described in reference to FIG. 1.

The jitter cancellation control component 155 may iteratively adjust the current level of a current source 230 included within the jitter cancellation component 160. For example, jitter cancellation control component 155 may, based on jitter measurements by a jitter measurement component 150, determine an adjusted current level of the current source 230—e.g., a current level of the current source 230 that minimizes the amount of jitter measured by the jitter measurement component 150 (and thus, e.g., between an input signal 105 and an output signal 110).

For example, the jitter cancellation control component 155 may set the current level of the current source 230 to a midpoint of the operating range of the current source and receive from the jitter measurement component 150 an indication of the amount of jitter measured by the jitter measurement component 150 with the current level of the current source 230 at the midpoint current level. The jitter cancellation control component 155 may then set the current level of the current source 230 to a next incremental current level and receive from the jitter measurement component 150 an indication of the amount of jitter measured by the jitter measurement component 150 with the current level of the current source 230 at the next incremental current level.

The jitter cancellation control component 155 may compare the jitter measured by the jitter measurement component 150 with the current level of the current source 230 at the next incremental current level to the jitter measured by the jitter measurement component 150 with the current level of the current source 230 at the midpoint current level. Based on this comparison, the jitter cancellation control component 155 may determine a next operating interval for the current source 230. For example, the jitter cancellation control component 155 may determine a next operating interval for the current source 230 as the upper half of the operating range of the current source if the jitter measured at the next incremental current level is less than the jitter measured at the midpoint current level, and may determine the next operating interval for the current source as the lower half of the operating range of the current source if the jitter measured at the next incremental current level is greater than the jitter measured at the midpoint current level.

The jitter cancellation control component 155 may then determine subsequent, progressively smaller operating intervals in like fashion. That is, the jitter cancellation control component 155 may determine a subsequent operating interval (e.g., the lower half or upper half of a current operating interval of the current source 230) based on a comparison of jitter with the current source 230 set to the midpoint of the current operating interval to jitter with the current source 230 set to a next incremental current level. The jitter cancellation control component 155 may thereby determine successive operating intervals, each smaller than last until—subject to the granularity with which the jitter cancellation control component 155 may control the current level of the current source 230—the jitter cancellation control component 155 determines a desired (e.g., adjusted, regulated) current level of the current source 230. The jitter cancellation control component 155 may then set the current level of the current source 230 to the desired current level.

For example, as illustrated in FIG. 4, the jitter cancellation control component 155 may determine that measured jitter with the current level of the current source 230 at the midpoint of a first operating interval (e.g., operating range) of the current source 230 ($Mid_0$) is greater than with the current level of the current source 230 at a next incremental current level ($Mid_0+1$). In response, the jitter cancellation control component 155 may at 405 determine a second operating interval for the current source 230 as the upper half of the first operating interval and set the current level of the current source 230 to the midpoint of the second operating interval ($Mid_1$).

The jitter cancellation control component 155 may then determine that measured jitter with the current level of the current source 230 at the midpoint of the second operating interval ($Mid_1$) is greater than with the current level of the current source 230 at a next incremental current level ($Mid_1+1$). In response, the jitter cancellation control component 155 may at 410 determine a third operating interval for the current source 230 as the upper half of the second operating interval and set the current level of the current source 230 to the midpoint of the third operating interval ($Mid_2$).

The jitter cancellation control component 155 may then determine that measured jitter with the current level of the current source 230 at the midpoint of the third operating interval ($Mid_2$) is less than with the current level of the current source 230 at a next incremental current level ($Mid_2+1$). In response, the jitter cancellation control component 155 may at 415 determine a fourth operating interval for the current source 230 as the lower half of the third operating interval and set the current level of the current source 230 to the midpoint of the fourth operating interval ($Mid_3$). The granularity with which the jitter cancellation control component 155 may control the current level of the current source 230 may be such that the jitter cancellation control component 155 may not determine any subsequent operating intervals and may determine that the midpoint of the fourth operating interval ($Mid_3$) is the desired (e.g., adjusted, regulated) current level of the current source 230.

In some cases, the current source 230 may be an IDAC, and the jitter cancellation control component 155 may set the current level of the current source 230 by setting a control value for the current source 230 (e.g., by indicating a binary control number, or indicating an increment or decrement of the control value (each control value corresponding to a current level) by some amount). For example, the jitter cancellation control component 155 may set the current level of the current source 230 to the midpoint of the operating range of the current source 230 by setting a first bit (e.g., the most significant bit (MSB)) of the binary control number of the current source to a first logic value (e.g., a high value, such as 1) and setting at least some, if not all, other bits of the binary control number to a second logic value (e.g., a low value, such as 0). Likewise, the jitter cancellation control component 155 may in some cases set the current level of the current source 230 to the next incremental current level by incrementing the binary control number for the current source (such as incrementing by one)—e.g., by changing the least significant bit (LSB) of the binary control number from the low logic value to the high logic value.

Each bit of the binary control number may correspond to an operating interval, with a high logic value for the bit corresponding to the upper half of the operating interval and a low logic value for the bit corresponding to the lower half of the operating interval. Thus, the jitter cancellation control component 155 may proceed to set various bits of the binary control number (e.g., one-by-one), which may be based on an order of decreasing bit significance, by comparing jitter with the bit set to the high logic value and the LSB set to the low logic value (with preceding bits maintained at their previously-determined values and any less significant bits between the bit and the LSB (which may be referred to as intervening bits set to the low logic value) to jitter with the bit set to the high logic value and the LSB set to the high logic value (with preceding bits maintained at their previously-determined values and intervening bits, if any, set to the low logic value).

If jitter with the bit set to the high logic value and the LSB set to the low logic value is greater than jitter with the bit set to the high logic value and the LSB set to the high logic value, then the jitter cancellation control component 155 may determine that the desired logic value for the bit is the high logic value. Conversely, if jitter with the bit set to the high logic value and the LSB set to the low logic value is less than jitter with the bit set to the high logic value and the LSB set to the high logic value, then the jitter cancellation control component 155 may determine that the desired logic value for the bit is the low logic value. The jitter cancellation control component 155 may determine desired value of the LSB by comparing jitter with the LSB at the low logic value to jitter with the LSB at the logic high value, with each more significant bit at its previously determined desired value.

Determining desired operating intervals for the current source 230 based on a comparison of jitter with the current source 230 at a midpoint of a current operating interval to jitter with the current source 230 at a next incremental current level (as opposed to, e.g., a comparison with the current source 230 at either a maximum or minimum current level) may minimize swings in current level of the current source 230 during the execution of the adjustment algorithm. This may beneficially expedite determination of the desired current level.

Though illustrated in the context of a current source 230 having four operating intervals (e.g., the entire operating range of the current source 230 and three successively smaller operating intervals), it is to be understood that adjustment algorithm 400 may be extended to determine the desired current level for a current source 230 having any number of operating intervals.

Figure 5:
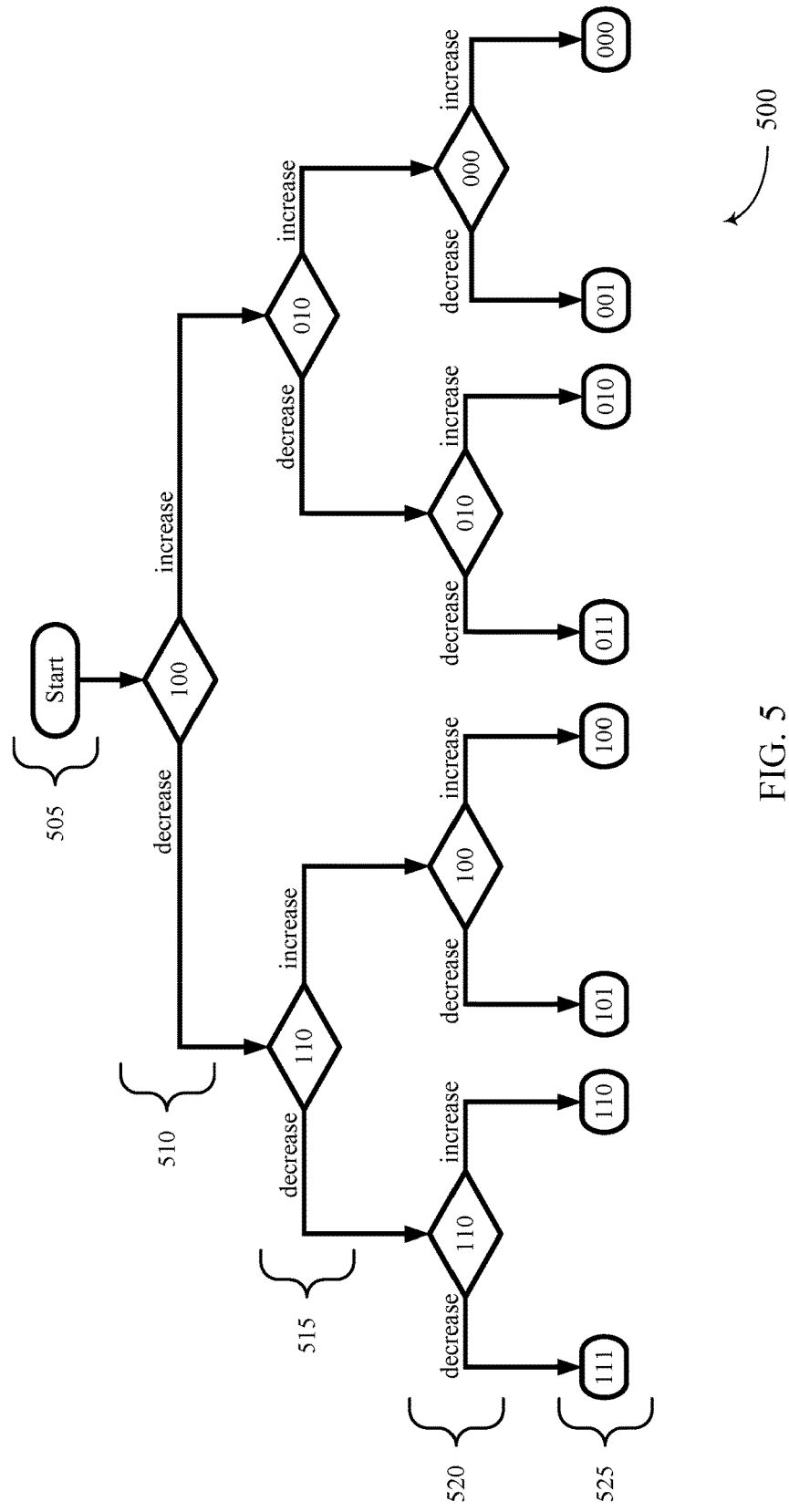
FIG. 5 illustrates an example of an adjustment algorithm for a clock distribution system that supports jitter cancellation with automatic performance adjustment in accordance with embodiments of the present disclosure.

FIG. 5 illustrates an example of an adjustment algorithm 500 that supports jitter cancellation with automatic performance adjustment in accordance with various embodiments of the present disclosure. In some cases, adjustment algorithm 500 may be implemented by a control component for a jitter cancellation component 160 with a clock distribution system 100. For example, adjustment algorithm 500 may be implemented by a jitter cancellation control component 155 as described in reference to FIG. 1.

In the example of adjustment algorithm 500, the current source 230 may be an IDAC, and the jitter cancellation control component 155 may set the current level of the current source 230 by setting the binary control number of the current source 230, which may comprise three bits. At 505, the jitter cancellation control component 155 may set a first bit (e.g., the MSB) of the binary control number of the IDAC to 1, which may be the high logic value, and may set all other digits of the IDAC to 0, which may be the low logic value.

At 510, the jitter cancellation control component 155 may determine a desired value for the MSB of the binary control number. For example, the jitter cancellation control component 155 may set the MSB to 1 and each less significant bit to 0, then determine whether incrementing the binary control number by one increases or decreases the amount of jitter measured by the jitter measurement component 150 (e.g., whether the amount of jitter measured by the jitter measurement component 150 is higher or lower with the binary control number set to 101 versus 100). If the amount of jitter measured by the jitter measurement component 150 is higher with the binary control number set to 101 versus 100, the jitter cancellation control component 155 may determine that the desired value for the MSB of the binary control number is 0. Conversely, if the amount of jitter measured by the jitter measurement component 150 is lower with the binary control number set to 101 versus 100, the jitter cancellation control component 155 may determine that the desired value for the MSB of the binary control number is 1.

At 515, the jitter cancellation control component 155 may determine a desired value for the middle bit of the binary control number. For example, the jitter cancellation control component 155 may set the middle bit to 1 and each less significant bit to 0, then determine whether incrementing the binary control number by one increases or decreases the amount of jitter measured by the jitter measurement component 150 (e.g., whether the amount of jitter measured by the jitter measurement component 150 is higher or lower with the binary control number set to x11 versus x10, where x is the desired value of the MSB determined at 510).

If the amount of jitter measured by the jitter measurement component 150 is higher with the binary control number set to x11 versus x10, the jitter cancellation control component 155 may determine that the desired value for the middle bit of the binary control number is 0. Conversely, if the amount of jitter measured by the jitter measurement component 150 is lower with the binary control number set to x11 versus x10, the jitter cancellation control component 155 may determine that the desired value for the middle bit of the binary control number is 1.

At 520, the jitter cancellation control component 155 may determine a desired value for the LSB of the binary control number. For example, the jitter cancellation control component 155 may set the LSB to 0, then determine whether incrementing the binary control number by one increases or decreases the amount of jitter measured by the jitter measurement component 150 (e.g., whether the amount of jitter measured by the jitter measurement component 150 is higher or lower with the binary control number set to xy1 versus xy0, where x is the desired value of the MSB determined at 510 and y is the desired value of the middle bit determined at 515).

If the amount of jitter measured by the jitter measurement component 150 is higher with the binary control number set to xy1 versus xy0, the jitter cancellation control component 155 may determine that the desired value for the LSB of the binary control number is 0. Conversely, if the amount of jitter measured by the jitter measurement component 150 is lower with the binary control number set to xy1 versus xy0, the jitter cancellation control component 155 may determine that the desired value for the LSB of the binary control number is 1.

At 525, the jitter cancellation control component 155 may set each bit of the binary control number to the corresponding desired value and thus may set the current level of the current source 230 to the desired current level. Though illustrated with a three-bit binary control number, it is to be understood that adjustment algorithm 500 may be extended to determine the desired value of each bit of a binary control number of any length.

Figure 6:
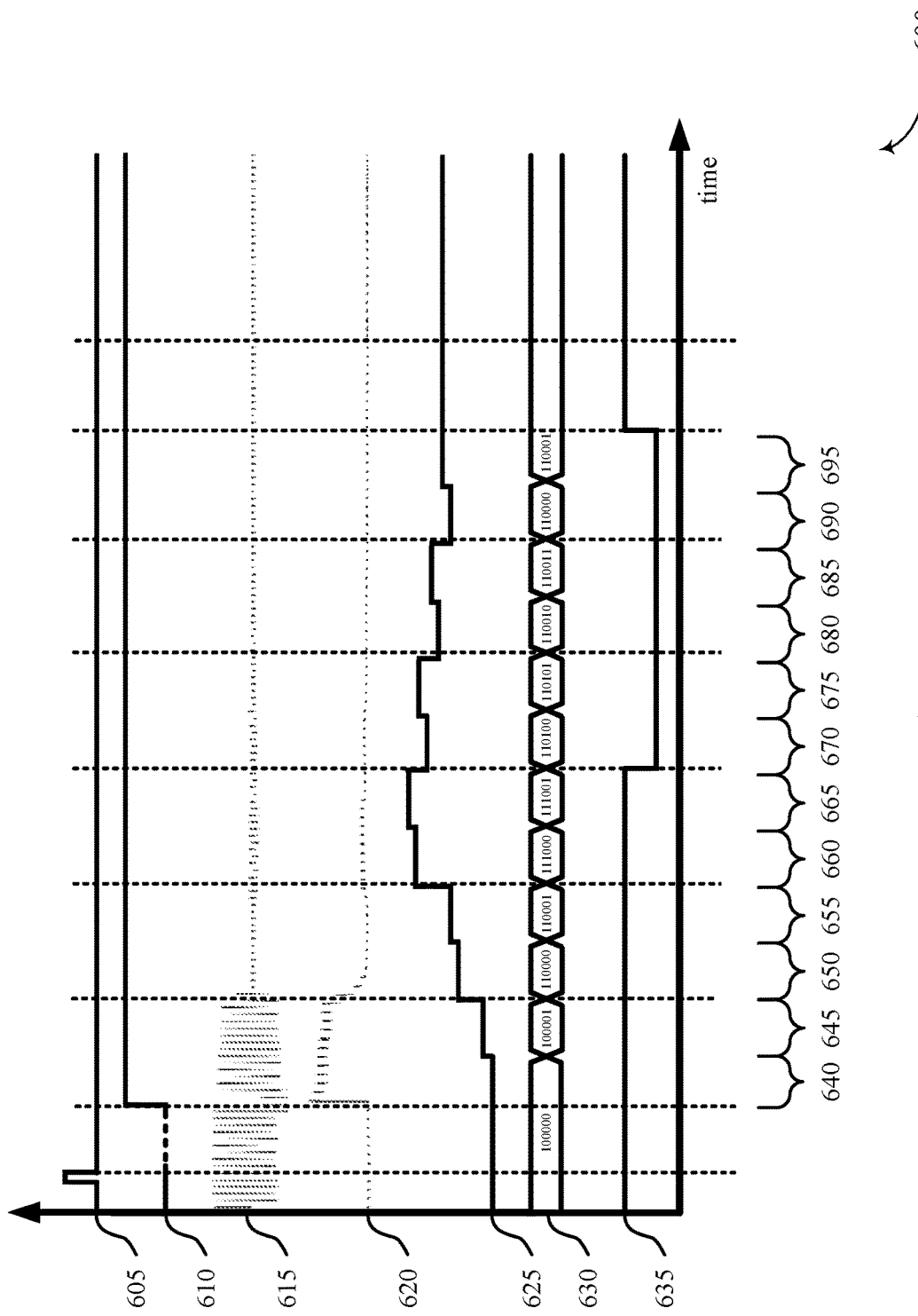
FIG. 6 illustrates an example of a timing diagram for a clock distribution system that supports jitter cancellation with automatic performance adjustment in accordance with embodiments of the present disclosure.

FIG. 6 illustrates an example of a timing diagram 600 for a clock distribution system that supports jitter cancellation with automatic performance adjustment in accordance with various embodiments of the present disclosure. In some cases, timing diagram 600 may illustrate the operation of a system such as clock distribution system 100 described in reference to FIG. 1.

Signal 605 may comprise a reset signal, and a positive pulse on signal 605 may reset the clock distribution system 100. Signal 610 may comprise an activation signal for the jitter cancellation system 125 (and thus for a jitter measurement component 150, a jitter cancellation control component 155, and a jitter cancellation component 160). In some cases, signal 610 may exhibit a low logic value until the DLL included in a clock distribution system 100 achieves delay lock, and then signal 610 may exhibit a high logic value. The jitter cancellation control component 155 may automatically execute an adjustment algorithm, such as adjustment algorithm 400 or adjustment algorithm 500 when signal 610 is at the high logic value.

Signal 615 may represent jitter between a feedback signal 137 and an input signal 105, and thus may reflect an amount of jitter between an output signal 110 and the input signal 105. Signal 620 may be generated and output by the jitter measurement component 150 and may be received by the jitter cancellation control component 155. In some cases, the amplitude of signal 620 may represent the amount (e.g., magnitude) of jitter measured by the jitter cancellation control component 155.

Signal 625 may represent the current level of a current source 230 included in the jitter cancellation component 160. Signal 630, which may be generated and output by the jitter cancellation control component 155 and received by the jitter cancellation component 160, may comprise a control signal for the current source 230. For example, signal 630 may comprise a binary control number for the current source 230. As shown in the example of timing diagram 600, the binary control number may have 6 bits.

Signal 635 may be generated by the jitter cancellation control component 155 and may represent a comparison of jitter levels as indicated by signal 620. When executing an adjustment algorithm, the jitter cancellation control component 155 may determine desired values of the bits of the binary control number based on whether signal 635 exhibits the high logic value or the low logic value, as described herein.

For example, at 640 and 645, the jitter cancellation control component 155 may determine a desired value for the MSB of the binary control number. At 640, the jitter cancellation control component 155 may set the initial value of the binary control number to 100000 (or the initial value of the binary control number may be preconfigured to 100000), which may set the current level of the current source to the corresponding level shown by signal 625. The jitter measurement component 150 may determine an associated amount of jitter and communicate the determined amount of jitter to the jitter cancellation control component 155 (e.g., via signal 620).

At 645, the jitter cancellation control component 155 may increment the binary control number to 100001 (as shown by signal 630), thereby adjusting the current level of the current source 230 to a next incremental current level (as shown by signal 625). The jitter measurement component 150 may determine an associated amount of jitter and communicate the determined amount of jitter to the jitter cancellation control component 155 (e.g., via signal 620). The jitter cancellation control component 155 may determine whether jitter increased or decreased relative to jitter at 640. Signal 635 may remain at the high logic value, which may indicate that jitter with the binary control number set to 100001 decreased relative to jitter at 640. Thus, in the example of timing diagram 600, the jitter cancellation control component 155 may determine that the desired value for the MSB of the binary control number is 1.

At 650 and 655, the jitter cancellation control component 155 may determine a desired value for the second bit (in order of decreasing bit significance) of the binary control number. At 650, the jitter cancellation control component 155 may set the binary control number to 110000 (as shown by signal 630), which may set the current level of the current source to the corresponding level shown by signal 625. The jitter measurement component 150 may determine an associated amount of jitter and communicate the determined amount of jitter to the jitter cancellation control component 155 (e.g., via signal 620).

At 655, the jitter cancellation control component 155 may increment the binary control number to 110001 (as shown by signal 630), thereby adjusting the current level of the current source 230 to a next incremental current level (as shown by signal 625). The jitter measurement component 150 may determine an associated amount of jitter and communicate the determined amount of jitter to the jitter cancellation control component 155 (e.g., via signal 620). The jitter cancellation control component 155 may determine whether jitter increased or decreased relative to jitter at 650. Signal 635 may remain at the high logic value, which may indicate that jitter with the binary control number set to 110001 decreased relative to jitter at 650. Thus, in the example of timing diagram 600, the jitter cancellation component 155 may determine that the desired value for the second bit of the binary control number is 1.

At 660 and 665, the jitter cancellation control component 155 may determine a desired value for the third bit (in order of decreasing bit significance) of the binary control number. At 660, the jitter cancellation control component 155 may set the binary control number to 111000 (as shown by signal 630), which may set the current level of the current source to the corresponding level shown by signal 625. The jitter measurement component 150 may determine an associated amount of jitter and communicate the determined amount of jitter to the jitter cancellation control component 155 (e.g., via signal 620).

At 665, the jitter cancellation control component 155 may increment the binary control number to 111001 (as shown by signal 630), thereby adjusting the current level of the current source 230 to a next incremental current level (as shown by signal 625). The jitter measurement component 150 may determine an associated amount of jitter and communicate the determined amount of jitter to the jitter cancellation control component 155 (e.g., via signal 620). The jitter cancellation control component 155 may determine whether jitter increased or decreased relative to jitter at 660. Signal 635 may transition to the low logic value, which may indicate that jitter with the binary control number set to 110001 increased relative to jitter at 660. Thus, in the example of timing diagram 600, the jitter cancellation control component 155 may determine that the desired value for the third bit of the binary control number is 0.

At 670 and 675, the jitter cancellation control component 155 may determine a desired value for the fourth bit (in order of decreasing bit significance) of the binary control number. At 670, the jitter cancellation control component 155 may set the binary control number to 110100 (as shown by signal 630), which may set the current level of the current source to the corresponding level shown by signal 625. The jitter measurement component 150 may determine an associated amount of jitter and communicate the determined amount of jitter to the jitter cancellation control component 155 (e.g., via signal 620).

At 675, the jitter cancellation control component 155 may increment the binary control number to 110101 (as shown by signal 630), thereby adjusting the current level of the current source 230 to a next incremental current level (as shown by signal 625). The jitter measurement component 150 may determine an associated amount of jitter and communicate the determined amount of jitter to the jitter cancellation control component 155 (e.g., via signal 620). The jitter cancellation control component 155 may determine whether jitter increased or decreased relative to jitter 670. Signal 635 may remain at the low logic value, which may indicate that jitter with the binary control number set to 110101 increased relative to jitter at 670. Thus, in the example of timing diagram 600, the jitter cancellation control component 155 may determine that the desired value for the fourth bit of the binary control number is 0.

At 680 and 685, the jitter cancellation control component 155 may determine a desired value for the fifth bit (in order of decreasing bit significance) of the binary control number. At 680, the jitter cancellation control component 155 may set the binary control number to 110010 (as shown by signal 630), which may set the current level of the current source to the corresponding level shown by signal 625. The jitter measurement component 150 may determine an associated amount of jitter and communicate the determined amount of jitter to the jitter cancellation control component 155 (e.g., via signal 620).

At 685, the jitter cancellation control component 155 may increment the binary control number to 110011 (as shown by signal 630), thereby adjusting the current level of the current source 230 to a next incremental current level (as shown by signal 625). The jitter measurement component 150 may determine an associated amount of jitter and communicate the determined amount of jitter to the jitter cancellation control component 155 (e.g., via signal 620). The jitter cancellation control component 155 may determine whether jitter increased or decreased relative to jitter at 680. Signal 635 may remain at the low logic value, which may indicate that jitter with the binary control number set to 110011 increased relative to jitter at 680. Thus, in the example of timing diagram 600, the jitter cancellation control component 155 may determine that the desired value for the fifth bit of the binary control number is 0.

At 690 and 695, the jitter cancellation control component 155 may determine a desired value for the LSB of the binary control number. At 690, the jitter cancellation control component 155 may set the binary control number to 110000 (as shown by signal 630), which may set the current level of the current source to the corresponding level shown by signal 625. The jitter measurement component 150 may determine an associated amount of jitter and communicate the determined amount of jitter to the jitter cancellation control component 155 (e.g., via signal 620).

At 695, the jitter cancellation control component 155 may increment the binary control number to 110001 (as shown by signal 630), thereby adjusting the current level of the current source 230 to a next incremental current level (as shown by signal 625). The jitter measurement component 150 may determine an associated amount of jitter and communicate the determined amount of jitter to the jitter cancellation control component 155 (e.g., via signal 620). The jitter cancellation control component 155 may determine whether jitter increased or decreased relative to jitter at 690. Signal 635 may transition to the high logic value, which may indicate that jitter with the binary control number set to 110001 decreased relative to jitter at 690. Thus, in the example of timing diagram 600, the jitter cancellation control component 155 may determine that the desired value for the LSB of the binary control number is 1.

Having determined the desired value of the binary control number as 110001, the jitter cancellation control component 155 may set or maintain the binary control number at 110001 until some change in the operation of the clock distribution system 100, such as a shut down and restart of the clock distribution system 100 or a change in some operational parameter. In some cases, to conserve power, aspects of the jitter cancellation system 125 (e.g., the jitter measurement component 150 and the jitter cancellation control component 155) may be deactivated once the, the jitter cancellation control component 155 sets the current level of the current source 230 to the desired current level (e.g., sets the binary control number to the desired value).

Figure 7:
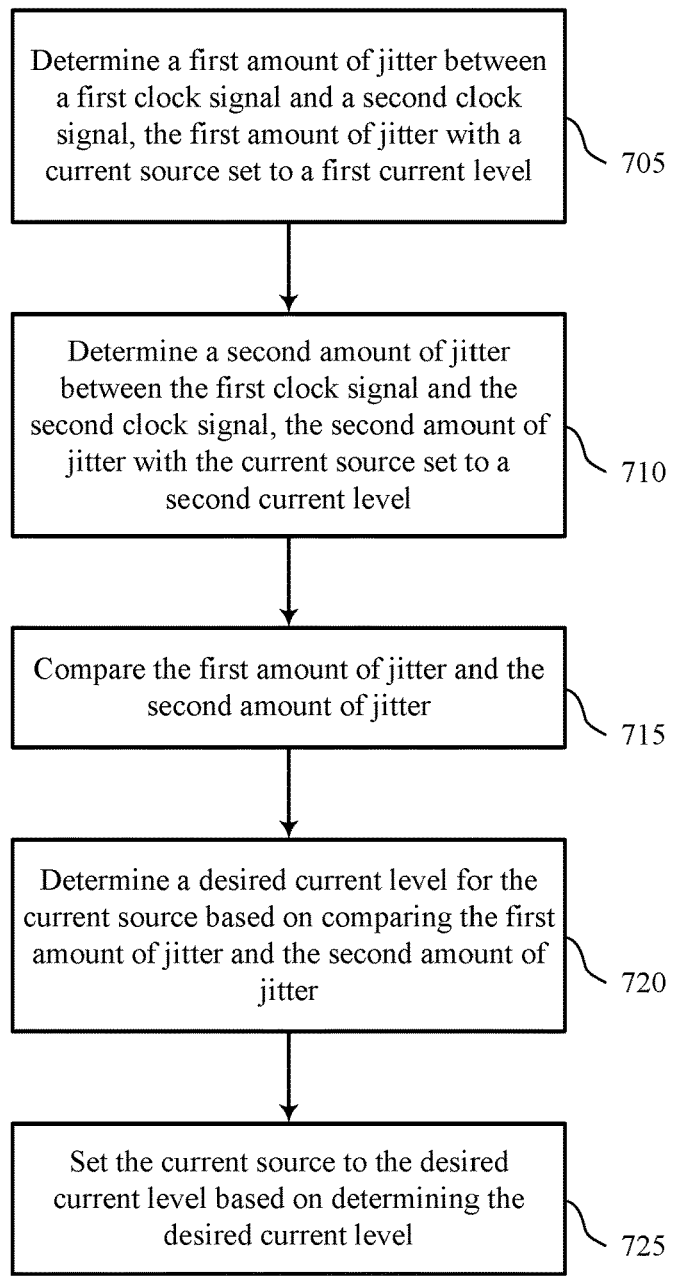
FIGS. 7-9 illustrate methods for jitter cancellation with automatic performance adjustment in accordance with embodiments of the present disclosure.

FIG. 7 shows a flowchart illustrating a method 700 for jitter cancellation with automatic performance adjustment in accordance with embodiments of the present disclosure. The operations of method 700 may be implemented by a jitter cancellation system 125 or its components as described herein as described herein. For example, the operations of method 700 may be performed by a jitter cancellation control component 155 as described herein. In some examples, a jitter cancellation system 125 may execute a set of codes to control the functional elements of an electronic device, such as a memory device, to perform the functions described below. Additionally or alternatively, the jitter cancellation system 125 may perform aspects of the functions described below using special-purpose hardware.

In some cases, the method may include—and an apparatus as described herein may include features, means, or instructions for—determining a first amount of jitter between a first clock signal and a second clock signal, the first amount of jitter with a current source set to a first current level, determining a second amount of jitter between the first clock signal and the second clock signal, the second amount of jitter with the current source set to a second current level, comparing the first amount of jitter and the second amount of jitter, determining a desired current level for the current source based at least in part on comparing the first amount of jitter and the second amount of jitter, and setting the current source to the desired current level based at least in part on determining the desired current level.

In some examples, the current source may be a digitally-controlled current source. Some examples of the method and apparatus described above may further include processes, features, means, or instructions for setting the current source to a current level by setting a binary control number. In some examples, setting the current source to the second current level may include adjusting the binary control number by one.

In some examples, determining the desired current level for the current source may comprises determining, in order of decreasing significance, a desired value for each bit of the binary control number. Some examples of the method and apparatus described above may further include processes, features, means, or instructions for determining an initial amount of jitter between the first clock signal and the second clock signal, the initial amount of jitter associated with setting the bit to a high logic value and some less significant bits (e.g., each less significant bit) of the binary control number to a low logic value. Some examples of the method and apparatus described above may further include processes, features, means, or instructions for determining a next amount of jitter between the first clock signal and the second clock signal, the next amount of jitter associated with setting the LSB to the high logic value. In some examples of the method and apparatus described above, setting the LSB to the high logic value comprises: incrementing the binary control number by one.

Some examples of the method and apparatus described above may further include processes, features, means, or instructions for determining the desired value of the bit as the high logic value or the low logic value based at least in part determining the initial amount of jitter and the next amount of jitter. Some examples of the method and apparatus described above may further include processes, features, means, or instructions for determining the desired value of the bit as the high logic value when the next amount of jitter may be less than the initial amount of jitter. Some examples of the method and apparatus described above may further include processes, features, means, or instructions for determining the desired value of the bit as the low logic value when the next amount of jitter may be greater than the initial amount of jitter.

In some examples of the method and apparatus described above, determining the desired current level for the current source may include determining a first operating interval as an upper half or a lower half of an operating range for the current source based at least in part on the first amount of jitter and the second amount of jitter. Some examples of the method and apparatus described above may further include processes, features, means, or instructions for determining one or more successive operating intervals for the current source based at least in part on comparing an initial amount of jitter associated with an intermediate current level within a current operating interval with a next amount of jitter associated with a next incremental current level within the current operating interval. Some examples of the method and apparatus described above may further include processes, features, means, or instructions for determining a successive operating interval as the upper half of the current operating interval if the next amount of jitter is less than the initial amount of jitter, and for determining the successive operating interval as the lower half of the current operating interval if the next amount of jitter is greater than the initial amount of jitter.

In some examples of the method and apparatus described above, the second clock signal may be a data strobe for a double data rate (DDR) output interface of a memory device.

For example, at 705 the jitter cancellation system 125 may determine a first amount of jitter between a first clock signal and a second clock signal, the first amount of jitter with a current source (e.g., a current source included in a jitter cancellation component 160) set to a first current level. The operations of 705 may be performed according to the methods described herein. In certain examples, aspects of the operations of 705 may be performed by a jitter cancellation control component 155 based on one or more signals received from a jitter measurement component 150 as described herein.

At 710 the jitter cancellation system 125 may determine a second amount of jitter between the first clock signal and the second clock signal, the second amount of jitter with the current source set to a second current level. The operations of 710 may be performed according to the methods described herein. In certain examples, aspects of the operations of 710 may be performed by a jitter cancellation control component 155 based on one or more signals received from a jitter measurement component 150 as described herein.

At 715 the jitter cancellation system 125 may compare the first amount of jitter and the second amount of jitter. The operations of 715 may be performed according to the methods described herein. In certain examples, aspects of the operations of 715 may be performed by a jitter cancellation control component 155 as described herein.

At 720 the jitter cancellation system 125 may determine a desired current level for the current source based on comparing the first amount of jitter and the second amount of jitter. The operations of 720 may be performed according to the methods described herein. In certain examples, aspects of the operations of 720 may be performed by a jitter cancellation control component 155 as described herein.

At 725 the jitter cancellation system 125 may set the current source to the desired current level based on determining the desired current level. For example, the jitter cancellation system 125 may specify a binary control number for the current source or may indicate a current level increment or decrement comprising some number of current levels. The operations of 725 may be performed according to the methods described herein. In certain examples, aspects of the operations of 725 may be performed by a jitter cancellation control component 155 as described herein.

Figure 8:
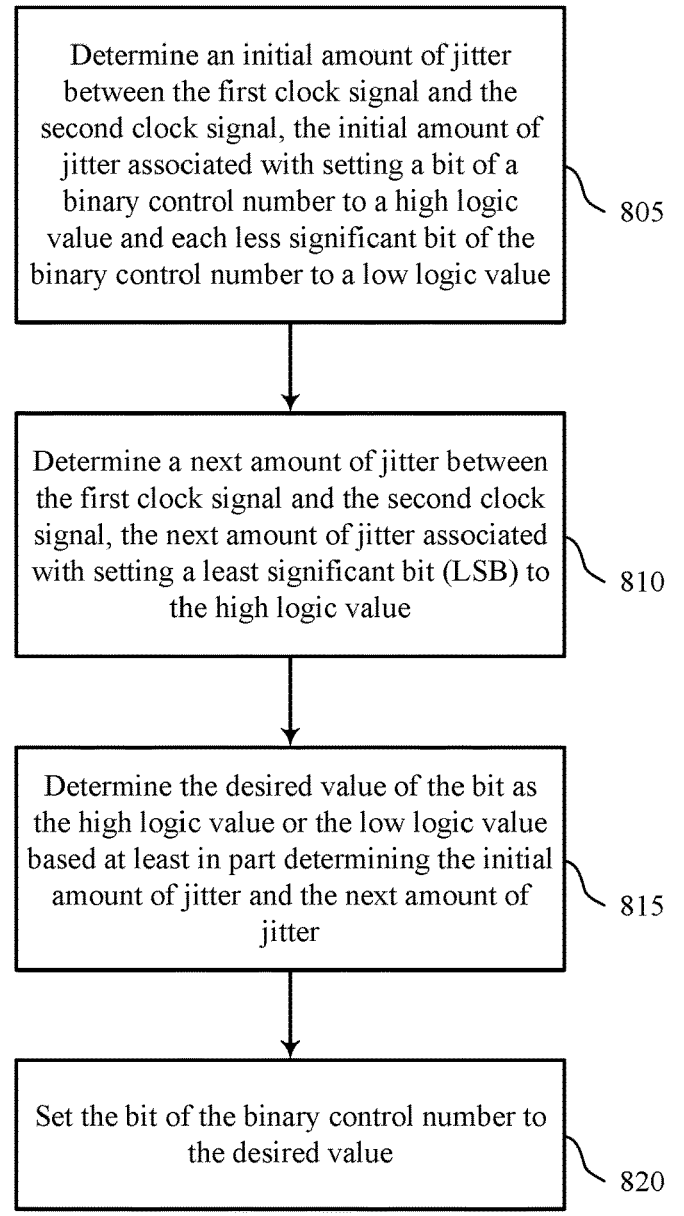

FIG. 8 shows a flowchart illustrating a method 800 for setting a bit of a binary control number for a current source 230 included in a jitter cancellation component 160 in accordance with embodiments of the present disclosure. The operations of method 800 may be implemented by a jitter cancellation system 125 or its components as described herein. For example, the operations of method 800 may be performed by a jitter cancellation control component 155 as described herein. In some examples, a jitter cancellation system 125 may execute a set of codes to control the functional elements of an electronic device, such as a memory device, to perform the functions described below. Additionally or alternatively, the jitter cancellation system 125 may perform aspects of the functions described below using special-purpose hardware.

At 805 the jitter cancellation system 125 may determine an initial amount of jitter between the first clock signal and the second clock signal, the initial amount of jitter associated with setting the bit to a high logic value (e.g., 1) and each less significant bit to a low logic value (e.g., 0). The operations of 805 may be performed according to the methods described herein. In certain examples, aspects of the operations of 805 may be performed by a jitter cancellation control component 155 based on one or more signals received from a jitter measurement component 150 as described herein.

At 810 the jitter cancellation system 125 may determine a next amount of jitter between the first clock signal and the second clock signal, the next amount of jitter associated with setting the LSB of the binary control number to the high logic value (e.g., incrementing the binary control number by one). The operations of 810 may be performed according to the methods described herein. In certain examples, aspects of the operations of 810 may be performed by a jitter cancellation control component 155 based on one or more signals received from a jitter measurement component 150 as described herein.

At 815 the jitter cancellation system 125 may determine the desired value of the bit as the high logic value or the low logic value based on determining the initial amount of jitter and the next amount of jitter. For example, the jitter cancellation system 125 may determine the desired value of the bit as the high logic value when the next amount of jitter is less than the initial amount of jitter, and may determine the desired value of the bit as the low logic value when the next amount of jitter is greater than the initial amount of jitter. The operations of 815 may be performed according to the methods described herein. In certain examples, aspects of the operations of 815 may be performed by a jitter cancellation control component 155 as described herein.

At 820 the jitter cancellation system 125 may set the bit of the binary control number based to the desired value. The operations of 855 may be performed according to the methods described herein. In certain examples, aspects of the operations of 855 may be performed by a jitter cancellation control component 155 as described herein.

Figure 9:
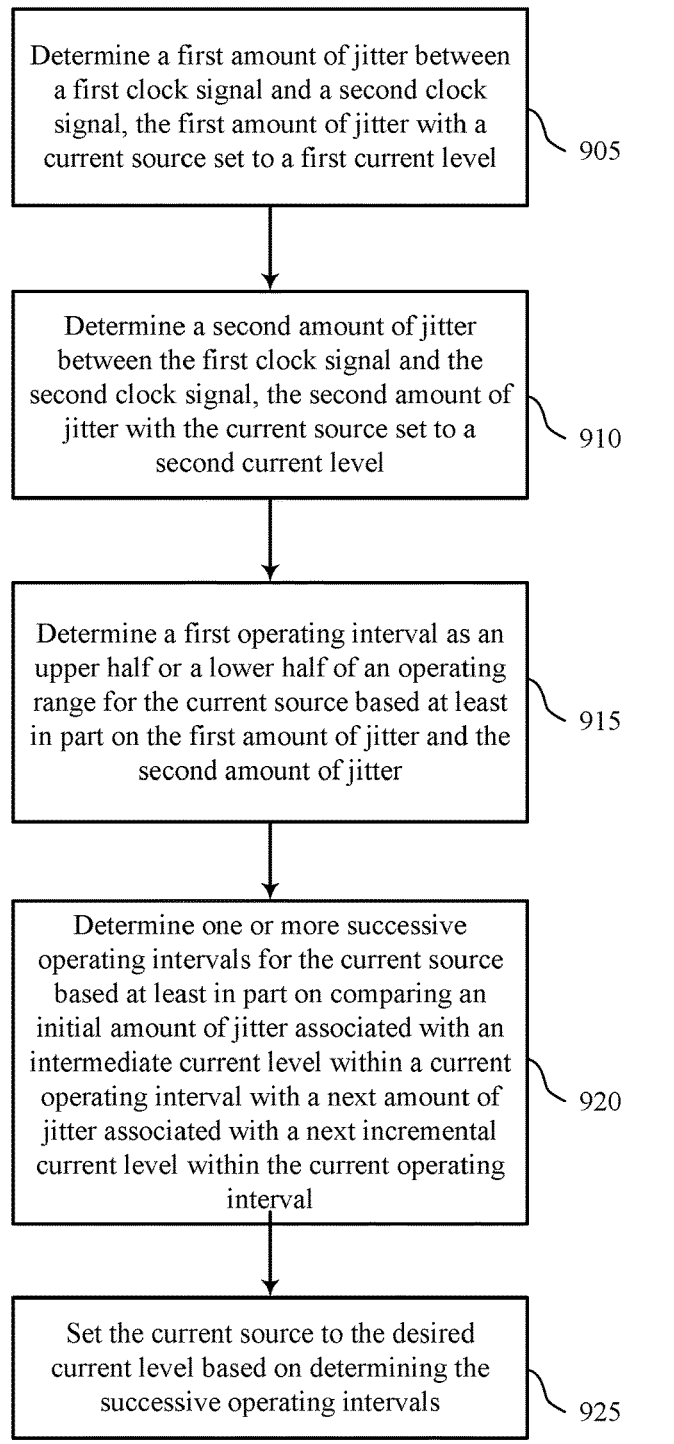

FIG. 9 shows a flowchart illustrating a method 900 for determining a desired current level of a current source 230 included in a jitter cancellation component 160 in accordance with embodiments of the present disclosure. The operations of method 900 may be implemented by a jitter cancellation system 125 or its components as described herein. For example, the operations of method 900 may be performed by a jitter cancellation control component 155 as described herein. In some examples, a jitter cancellation system 125 may execute a set of codes to control the functional elements of an electronic device, such as a memory device, to perform the functions described below. Additionally or alternatively, the jitter cancellation system 125 may perform aspects of the functions described below using special-purpose hardware.

At 905 the jitter cancellation system 125 may determine a first amount of jitter between a first clock signal and a second clock signal, the first amount of jitter with the current source 230 set to a first current level. The operations of 905 may be performed according to the methods described herein. In certain examples, aspects of the operations of 905 may be performed by a jitter cancellation control component 155 based on one or more signals received from a jitter measurement component 150 as described herein.

At 910 the jitter cancellation system 125 may determine a second amount of jitter between the first clock signal and the second clock signal, the second amount of jitter with the current source 230 set to a second current level. The operations of 910 may be performed according to the methods described herein. In certain examples, aspects of the operations of 910 may be performed by a jitter cancellation control component 155 based on one or more signals received from a jitter measurement component 150 as described herein.

At 915 the jitter cancellation system 125 may determine a first operating interval as an upper half or a lower half of an operating range for the current source 230 based at least in part on the first amount of jitter and the second amount of jitter. The operations of 935 may be performed according to the methods described herein. In certain examples, aspects of the operations of 935 may be performed by a jitter cancellation control component 155 as described herein.

At 920 the jitter cancellation system 125 may determine one or more successive operating intervals for the current source 230 based at least in part on comparing an initial amount of jitter associated with an intermediate current level within a current operating interval with a next amount of jitter associated with a next incremental current level within the current operating interval. The operations of 920 may be performed according to the methods described herein. In certain examples, aspects of the operations of 920 may be performed by a jitter cancellation control component 155 as described herein.

At 925 the jitter cancellation system 125 may set the current source 230 to the desired current level based on determining the successive operating intervals. For example, jitter cancellation system 125 may set the current level of the current source 230 to the midpoint of a final operating interval, the final operating interval corresponding to the finest granularity with which jitter cancellation system 125 may control the current level of the current source 230. In some cases, the current source 230 may be an IDAC, and each bit of a binary control number for the current source may correspond to an operating interval, with a bit set to the high logic value representing the upper half of the corresponding operating interval, and a bet set to the low logic value representing the lower half of the corresponding operating interval. The operations of 945 may be performed according to the methods described herein. In certain examples, aspects of the operations of 945 may be performed by a jitter cancellation control component 155 as described herein.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a feedback loop configured to receive a first signal and output a second signal;
   a first delay component configured to introduce, into the feedback loop, a first delay that is based at least in part on a supply voltage; and
   a second delay component configured to introduce, into the feedback loop, a second delay that is proportional to the supply voltage.

2. The apparatus of claim 1, further comprising:
   circuitry configured to determine an amount of jitter between the first signal and the second signal and adjust a current source based at least in part on the amount of jitter between the first signal and the second signal.

3. The apparatus of claim 2, further comprising:
   a component configured to adjust a current level of the current source based at least in part on determining a value for a bit of a binary control number for the current source.

4. The apparatus of claim 2, wherein the second delay component is configured to introduce the first delay, the second delay, or both into the feedback loop based at least in part on a current level of the current source.

5. The apparatus of claim 1, wherein the second delay component comprises circuitry configured to generate a voltage based at least in part on the supply voltage and a current level of a current source, and wherein the second delay is based at least in part on the voltage.

6. The apparatus of claim 1, wherein the apparatus is configured to generate the second signal for an external double data rate (DDR) memory device, or wherein the apparatus is configured to generate the second signal as a data strobe signal for an interface of an external memory device.

7. The apparatus of claim 1, wherein the first delay is inversely proportional to the supply voltage.

8. An apparatus, comprising:
   a bias circuit configured to generate a first voltage that is based at least in part on a current level of a current source and that based at least in part on a supply voltage;
   a delay circuit configured to receive an input signal and introduce a delay into an output signal, the delay being based at least in part on the first voltage.

9. The apparatus of claim 8, wherein the delay circuit is configured to:
generate a second voltage based at least in part on the bias circuit generating the first voltage, wherein the delay is based at least in part on the first voltage and the second voltage.

10. The apparatus of claim 9, wherein the second voltage is inversely proportional to the first voltage, and wherein the current level of the current source is proportional to the supply voltage.

11. The apparatus of claim 8, further comprising:
a voltage regulator coupled with the bias circuit and configured to generate the supply voltage.

12. The apparatus of claim 8, wherein the delay circuit comprises an inverter coupled with the bias circuit and the delay circuit.

13. The apparatus of claim 8, wherein the bias circuit is configured to:
receive a signal for controlling the current source, and
generate the first voltage based at least in part on receiving the signal.

14. The apparatus of claim 8, wherein the bias circuit is configured to generate the first voltage as inversely proportional to the current level of the current source.

15. The apparatus of claim 8, wherein the delay circuit is configured to generate the delay between the input signal and the output signal, the output signal proportional to the first voltage.

16. A method, comprising:
determining a first amount of jitter between a first signal and a second signal based at least in part on a first current level of a current source;
determining a second amount of jitter between the first signal and the second signal based at least in part on a second current level of the current source; and
determining a desired current level for the current source based at least in part on comparing the first amount of jitter and the second amount of jitter.

17. The method of claim 16, further comprising:
setting the current source to the desired current level based at least in part on determining the desired current level, wherein determining the desired current level comprises determining a value for at least one bit of a binary control number associated with the current source.

18. The method of claim 17, wherein setting the current source to the desired current level comprises:
setting the at least one bit of the binary control number associated with the current source based at least in part on determining the desired current level.

19. The method of claim 17, further comprising:
determining a desired value for a plurality of bits of the binary control number; and
adjusting the plurality of bits of the binary control number in a decreasing significance of each of the plurality of bits.

20. The method of claim 19, wherein adjusting the plurality of bits comprises:
setting a most significant bit (MSB) of the plurality of bits to a high logic value; and
setting a least significant bit (LSB) of the plurality of bits to a low logic value.

* * * * *